United States Patent
Heuell et al.

(10) Patent No.: US 6,476,595 B1
(45) Date of Patent: Nov. 5, 2002

(54) ADVANCED INSTRUMENT PACKAGING FOR ELECTRONIC ENERGY METER

(75) Inventors: Peter W. Heuell, Raleigh, NC (US); Garry M. Loy, Raleigh, NC (US); Russell C. Broome, Garner, NC (US); Lars Anders Lindqvist, Nykoping (SE)

(73) Assignee: ABB Automation Inc., Wickliffe, OH (US)

( * ) Notice: Subject to any disclaimer, the term of this patent is extended or adjusted under 35 U.S.C. 154(b) by 0 days.

(21) Appl. No.: 09/490,992

(22) Filed: Jan. 26, 2000

Related U.S. Application Data
(60) Provisional application No. 60/117,394, filed on Jan. 27, 1999.

(51) Int. Cl.[7] .............................................. G01R 11/32
(52) U.S. Cl. ...................................................... 324/142
(58) Field of Search ................................. 324/142, 156, 324/157

(56) References Cited

U.S. PATENT DOCUMENTS

| | | | |
|---|---|---|---|
| 3,334,276 A | * 8/1967 | Bateman et al. ............ | 361/666 |
| 4,959,607 A | * 9/1990 | Coryea et al. ........... | 324/103 R |
| 5,001,420 A | 3/1991 | Germer et al. ............... | 324/142 |
| 5,173,657 A | 12/1992 | Holdsclaw .................... | 324/142 |
| 5,270,639 A | * 12/1993 | Moore .......................... | 324/142 |
| 5,742,512 A | 4/1998 | Edge et al. .................. | 364/480 |
| 5,966,010 A | 10/1999 | Loy et al. .................... | 324/142 |

\* cited by examiner

*Primary Examiner*—N. Le
*Assistant Examiner*—Vincent Q. Nguyen
(74) *Attorney, Agent, or Firm*—Woodcock Washburn LLP

(57) ABSTRACT

An electronic energy meter and its package is described in which the meter package has a reduced number of parts, and the main circuit board assembly has the metering electronics on board, thereby eliminating the need for flying leads and point-to-point wiring within the package. The energy meter includes a first enclosure portion, a circuit board assembly for performing metering functions, a partial terminal block, and a second enclosure portion. The first and second enclosure portions are mateable with each other to form a meter package, in which the circuit board assembly and partial terminal block are at least partially contained within the meter package.

17 Claims, 24 Drawing Sheets

ADVANCED INSTRUMENT PACKAGING FOR ELECTRONIC ENERGY METER

RELATED APPLICATION DATA

The present application claims priority from provisional application Ser. No. 60/117,394, having a filing date of Jan. 27, 1999.

FIELD OF THE INVENTION

The present invention relates generally to electronic energy meters, and more particularly to packaging for electronic energy meters.

BACKGROUND OF THE INVENTION

Programmable electronic energy meters are rapidly replacing electro-mechanical meters due to the enhanced functionality achieved using programmable logic integrated into solid-state electronic meters. Some of these meters can be used to meter various different electrical services without hardware modification. For example, meters having a voltage operating range between 98 Vrms to 526 Vrms are capable of operation with either 120 V or 480 V services. U.S. Pat. No. 5,457,621, dated Oct. 10, 1995, entitled SWITCHING POWER SUPPLY HAVING VOLTAGE BLOCKING CLAMP, assigned to ABB Automation Inc. discloses examples of such meters. In addition, some meters are constructed for use with any 3-wire or any 4-wire service, also disclosed in U.S. Pat. No. 5,457,621.

However, many meters have complex packages that are difficult to assemble and which make it difficult to test the meter, leading to increased costs and lower reliability. Therefore, there remains a need for an electronic meter package that is easy to assemble, reliable, and permits easy testing of the enclosed meter.

SUMMARY OF THE INVENTION

The present invention is directed to an electronic energy meter and its package. The meter package has a reduced number of parts, and the main circuit board assembly has the metering electronics on board, thereby eliminating the need for flying leads and point-to-point wiring within the package. Thus, the meter package is mechanically simplified compared to presently available meter packages, resulting in a lower cost and a more reliable meter contained therein.

According to aspects of the invention, the meter package comprises four primary parts, and eliminates the need for screw or rivet type fasteners. The only interconnections (electrical connections between the circuit board and metal hardware in the meter) are accomplished by the use of a voltage spring between the circuit board and the current bus conductors.

According to one aspect of the invention, current sensing elements are disposed on the circuit board. This allows current conductors to be installed through the current sensors during the mechanical assembly of the enclosure.

According to further aspects of the present invention, instead of a separate component known as a terminal block, the present invention has features molded into the enclosure bottom half, along with a multifunction partial or upper terminal block to provide the desired isolation between metal components.

According to another aspect of the invention, a serialized data label is incorporated into the package, thereby eliminating the need for adhesive and thus reducing overall production costs.

According to further aspects of the present invention, the meter further comprises a binocular that provides an uninterrupted link between the meter and an external device. The binocular comprises two directional guides that are separated by a rib.

According to further aspects of the present invention, the meter further comprises an actuator switch or pushbutton that can actuate or perform two functions with one button.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DESCRIPTION OF EXEMPLARY EMBODIMENTS AND BEST MODE

Figure 1:
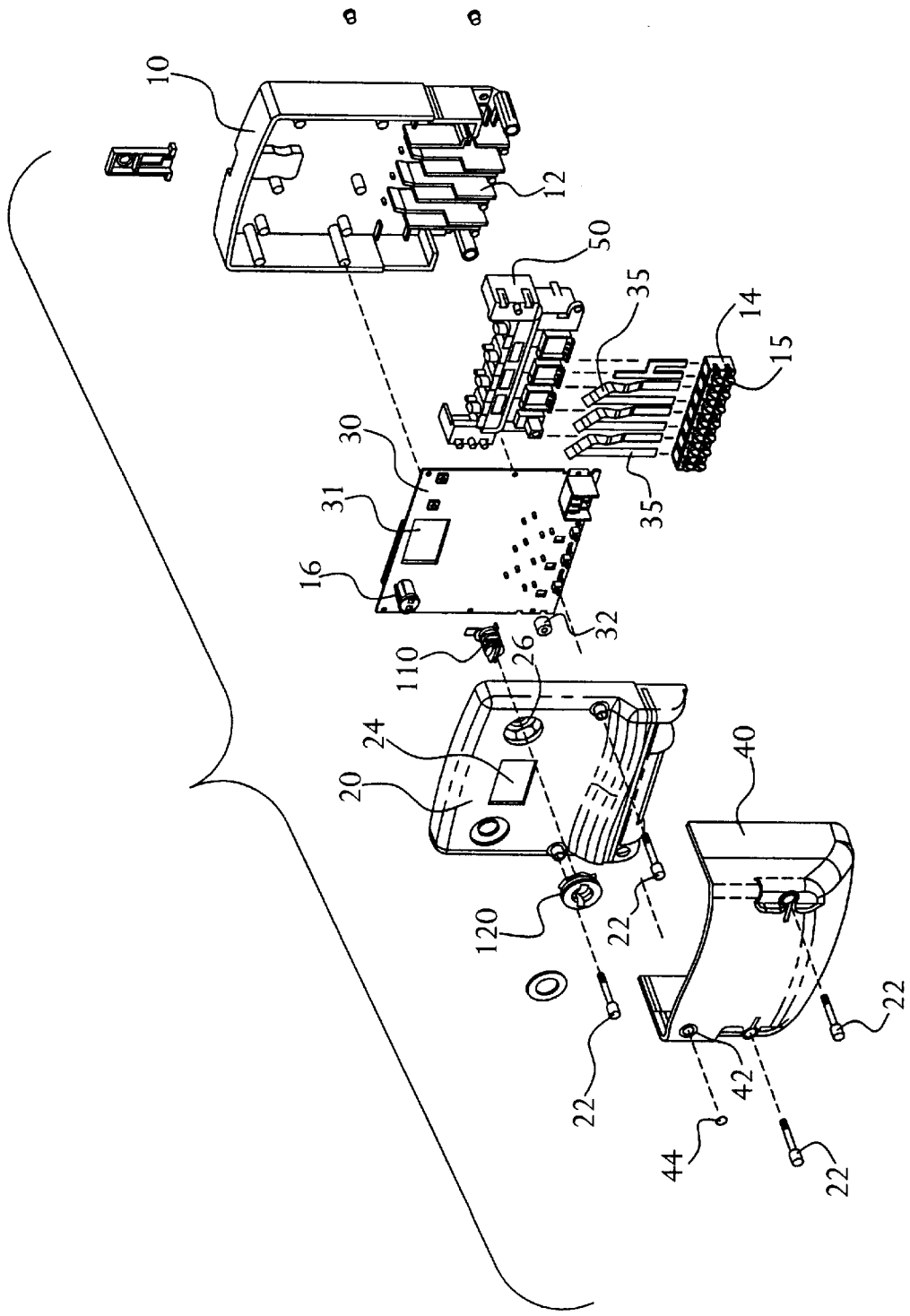
FIG. 1 is a schematic diagram of a meter assembly, exploded, in accordance with the present invention.
Figure 2:
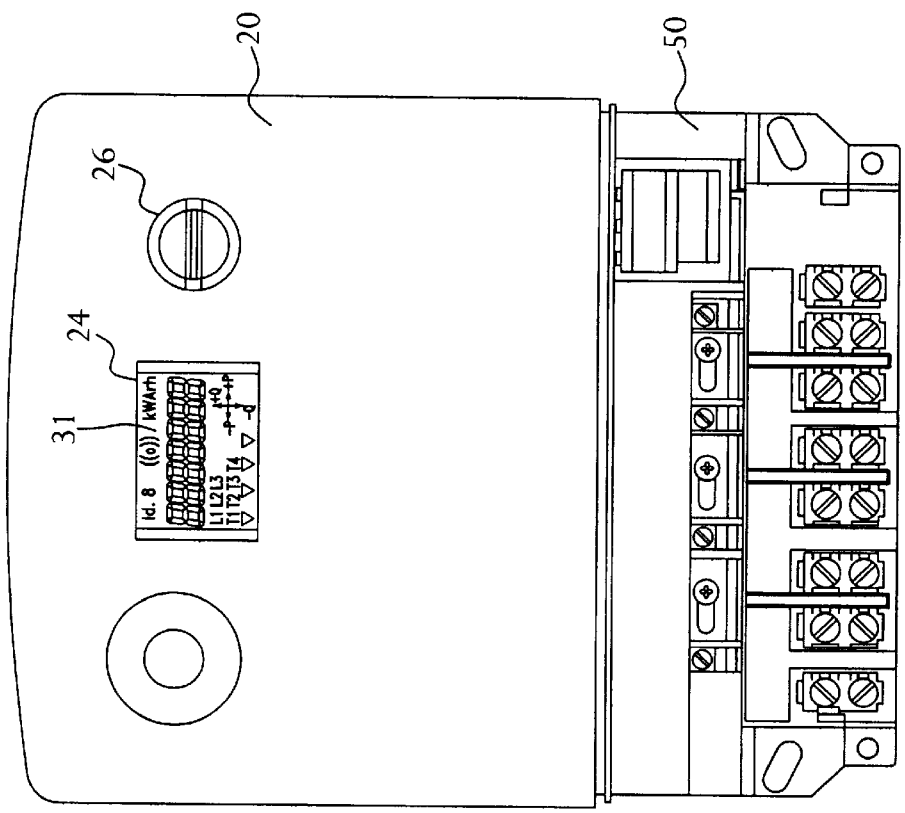
FIG. 2 is a front view of an exemplary meter (with the wiring cover removed) in accordance with the present invention.

A perspective view (exploded) of an exemplary meter in accordance with the present invention is shown in FIG. 1. The meter comprises a first enclosure portion 10 and a second enclosure portion 20 that together form a case for containing the electrical components (e.g., a circuit board assembly 30). The meter further comprises a wiring cover 40 that attaches to the second enclosure portion 20. A front view of an exemplary meter is shown in FIG. 2 (with the wiring cover 40 removed).

The first enclosure portion 10 acts as the rear or base of the meter and comprises terminal block features 12 that eliminate the need for a complete separate terminal block. The terminal block features 12 form voltage isolation barriers between the various metal parts at different voltage potentials when they are encased in the assembly. This function works in conjunction with a partial terminal block 50 that is provided. The partial terminal block 50 has similar features as the terminal block features 12 and has features designed to mesh in an interlocking manner with the terminal block features 12 to form voltage isolation between the components it serves, while providing unrestricted access to the internal metal components and ease of assembly. Thus, instead of a separate component known as a terminal block, the present invention has features 12 molded into the bottom portion of the first enclosure portion 10, along with a multifunction partial or upper terminal block 50 to provide the desired isolation between metal components. This arrangement provides superior performance by simplifying the assembly steps, permitting simultaneous assembly in clamshell fashion around all the components, and, at the same time, yielding higher voltage creeping distances between components. The total number of components is reduced because some of the metal parts are combined into one.

The second enclosure portion 20 acts as the front or top of the meter and preferably comprises a semi-transparent material to eliminate the need for a separate front cover. A window area 24 is provided for the digital display 31 of the circuit board assembly and product nameplate, for example. The other areas of the second enclosure portion 20 can be textured to provide a frosted appearance, thereby desirably obscuring the view into the inside of the meter product. This eliminates the need to have windows of separate clear material attached to the enclosure 20 or a separate front cover, and reduces the number of components.

The circuit board assembly 30 contains the electrical components and circuitry for performing typical meter functions, such as that described in U.S. patent application Ser. No. 09/201,610, filed Nov. 30, 1998, entitled ENERGY METER HAVING PROGRAMMABLE FUNCTIONS, and incorporated herein by reference. Although the electrical components and circuitry of the circuit board assembly 30 can be any meter electrical components and circuitry that provide the desired functionality, an exemplary circuit board assembly having features in accordance with the present invention is now described.

Figure 3:
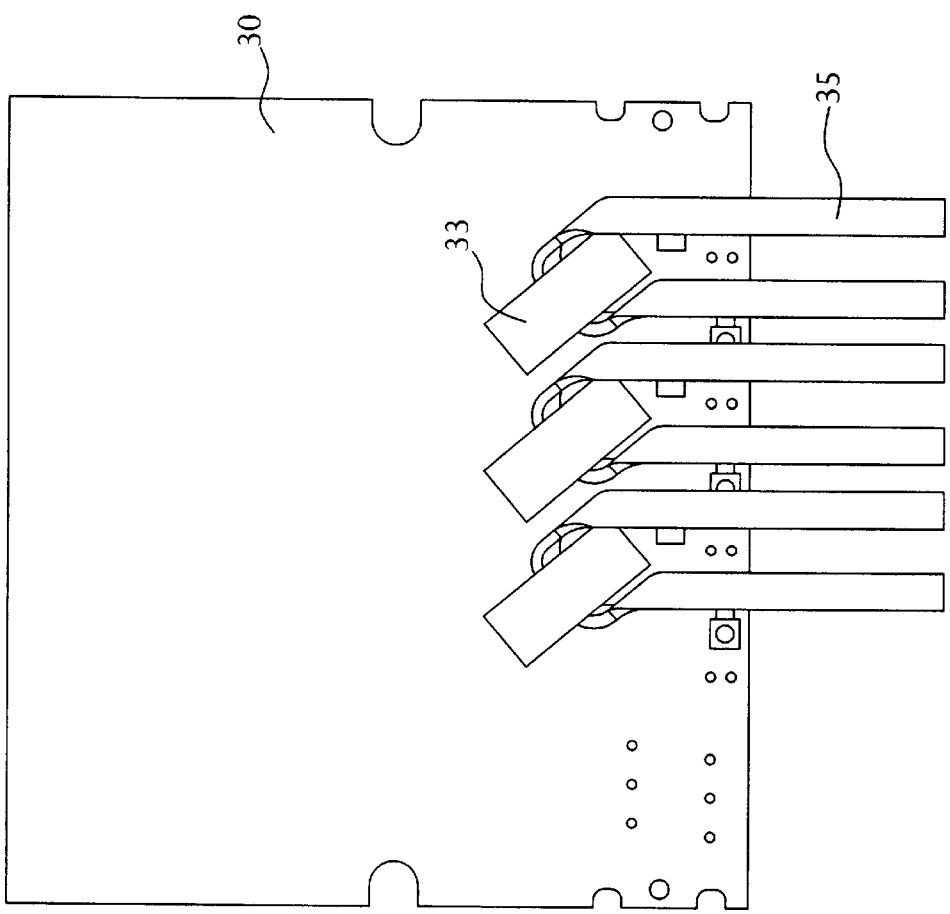
FIG. 3 is a top view of an exemplary circuit board assembly with current sensors and current conductors in accordance with the present invention.

Preferably, the circuit board assembly 30 comprises toroidal current sensors 33. As shown in FIG. 3, current sensors 33 are disposed at approximately 45-degree angles on the circuit board assembly 30. The toroidal current sensors 33 are mounted on the circuit board parallel to each other, but at an approximately 45-degree angle to the edge of the circuit board. This allows the current sensors 33 to be pre-installed on the circuit board assembly 30 using any conventional technique such as a wave solder technique. Although any current sensors can be used, current sensors having current transformers having low permeability cores (e.g., a permeability less than about 10,000 and preferably between about 1000 and 10,000) that are nanocrystalline or amorphous are preferred. An example of preferred cores are amorphous cores manufactured by Vacuumschmelze located in Germany. The advantage of this configuration is that it allows subsequent assembly of current conductors 35 through the center of each individual current sensor 33 after the current sensors 33 are mounted on the circuit board assembly 30. This configuration eliminates point-to-point wiring and flying leads in the assembly, and provides a very compact assembly.

Figure 4:
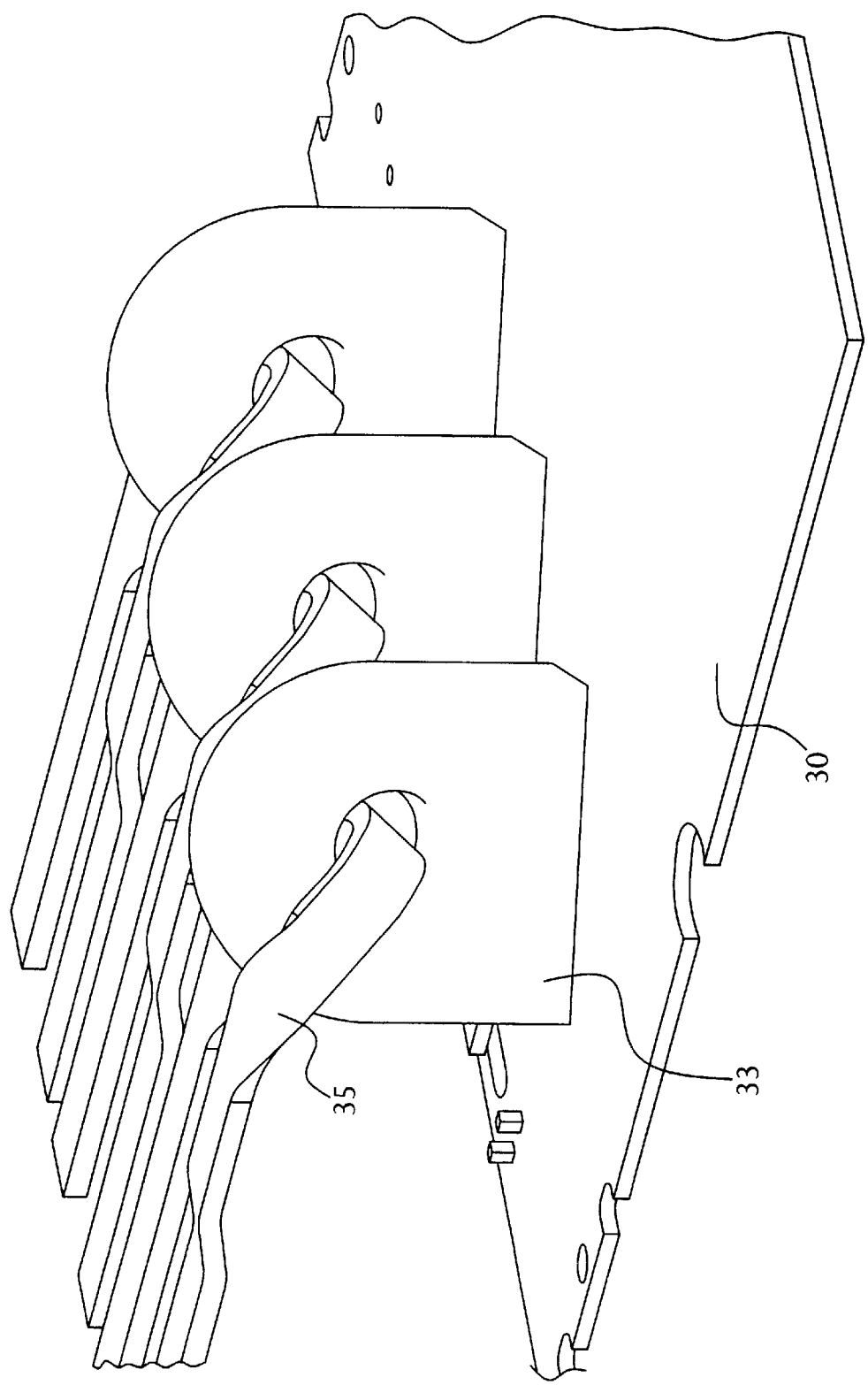
FIG. 4 is a side perspective view of an exemplary circuit board assembly with current sensors and current conductors in accordance with the present invention.
Figure 5A:
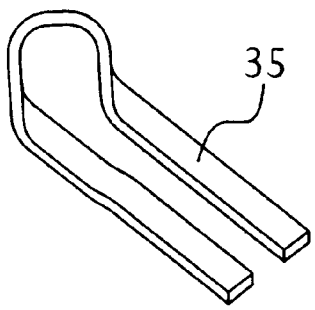
FIGS. 5A, 5B, 5C, and 5D are schematic diagrams at various views of an exemplary current conductor in accordance with the present invention.
Figure 5B:
Figure 5C:
Figure 5D:
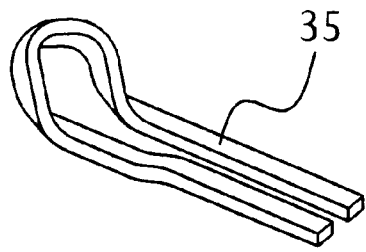

A current conductor 35 is inserted through the center of each current sensor 33, as shown in FIGS. 3 and 4. Each current conductor 35 preferably comprises flat wires, instead of the conventional round wires, thereby enhancing the contact surface area. Preferably, the wires are formed, instead of stamped or punched, from a spool of flat wire, resulting in substantially zero waste. FIGS. 5A, 5B, 5C, and 5D show top, side, front, and perspective views, respectively, of an exemplary current conductor. The angular bends in the wire allow it to be used in very compact assembly while maintaining desired separation between conductors due to the flat thickness dimension being advantageously utilized.

Figure 6:
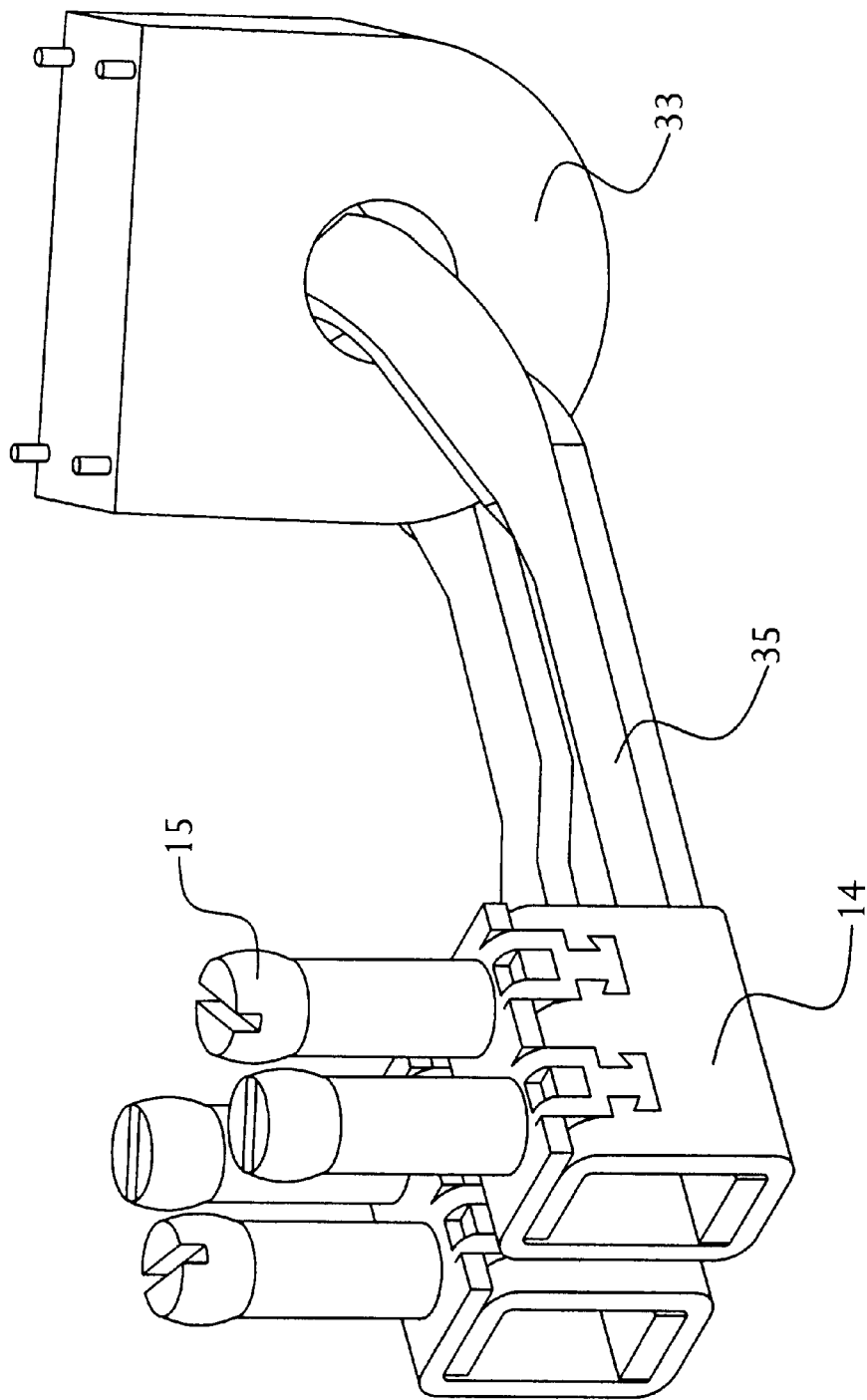
FIG. 6 is a side perspective view of an exemplary current sensor assembly in accordance with the present invention.
Figure 7:
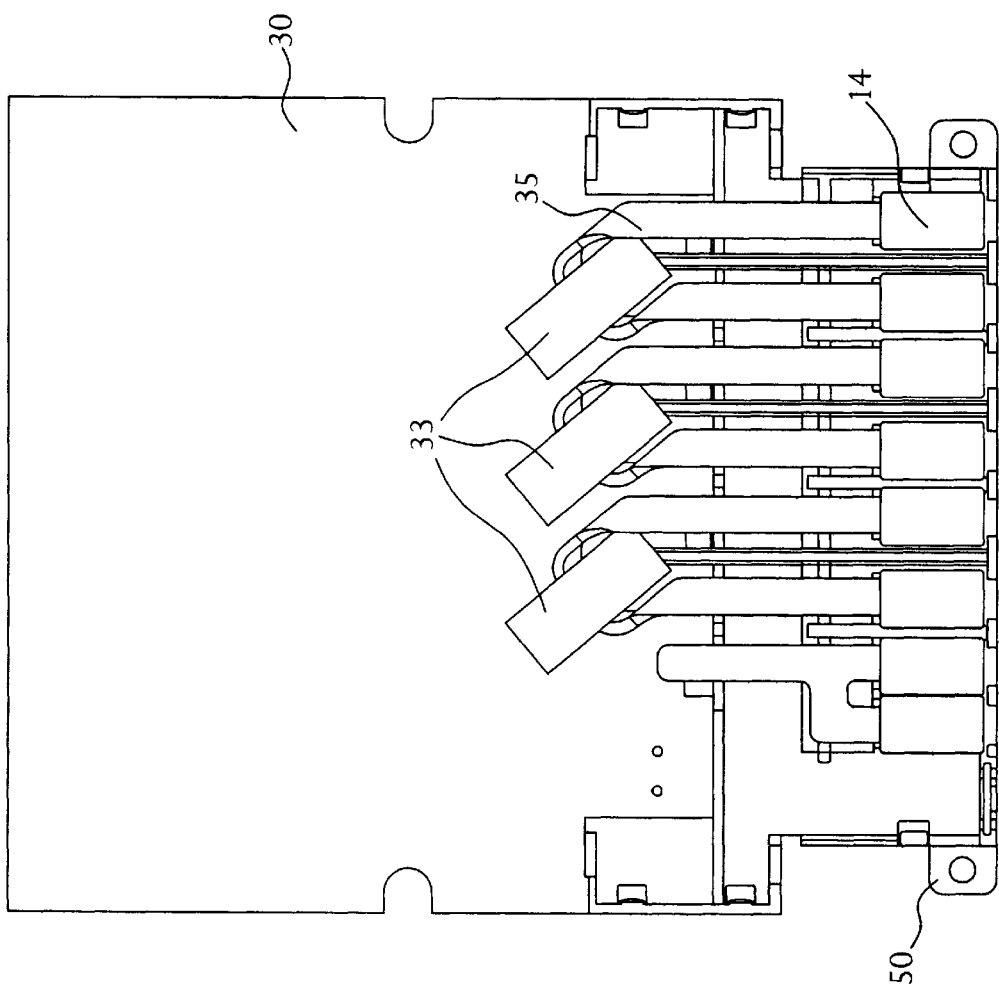
FIG. 7 is a top view of an exemplary current sensor assembly with circuit board assembly and partial terminal block in accordance with the present invention.

The ends of the current conductor 35 are inserted into a wire clamp 14 and fastened by a wire clamp screw 15, as shown in FIG. 6. The wire clamps are attached by conventional fasteners to the partial terminal block 50, as shown in FIGS. 7.

The toroidal current sensors 33 are disposed so that the current conductors 35 are installed therethrough during the mechanical assembly of the enclosure. In this manner, individual test probes can be implemented for a current source while the current sensors 33, mounted in close proximity to each other for a more compact design, are mounted and electrically connected to the circuit board, effectively creating a complete, working meter before final assembly in the enclosure portions 10 and 20. This makes it possible to calibrate and test the "meter" as a circuit board, or component of the final assembly rather than only being able to calibrate and test the meter after final assembly in the enclosure. Thus, rework of failed circuits is easier, and the opportunity is provided to perform final assembly in locations where testing and calibration equipment is not available.

Figure 8:
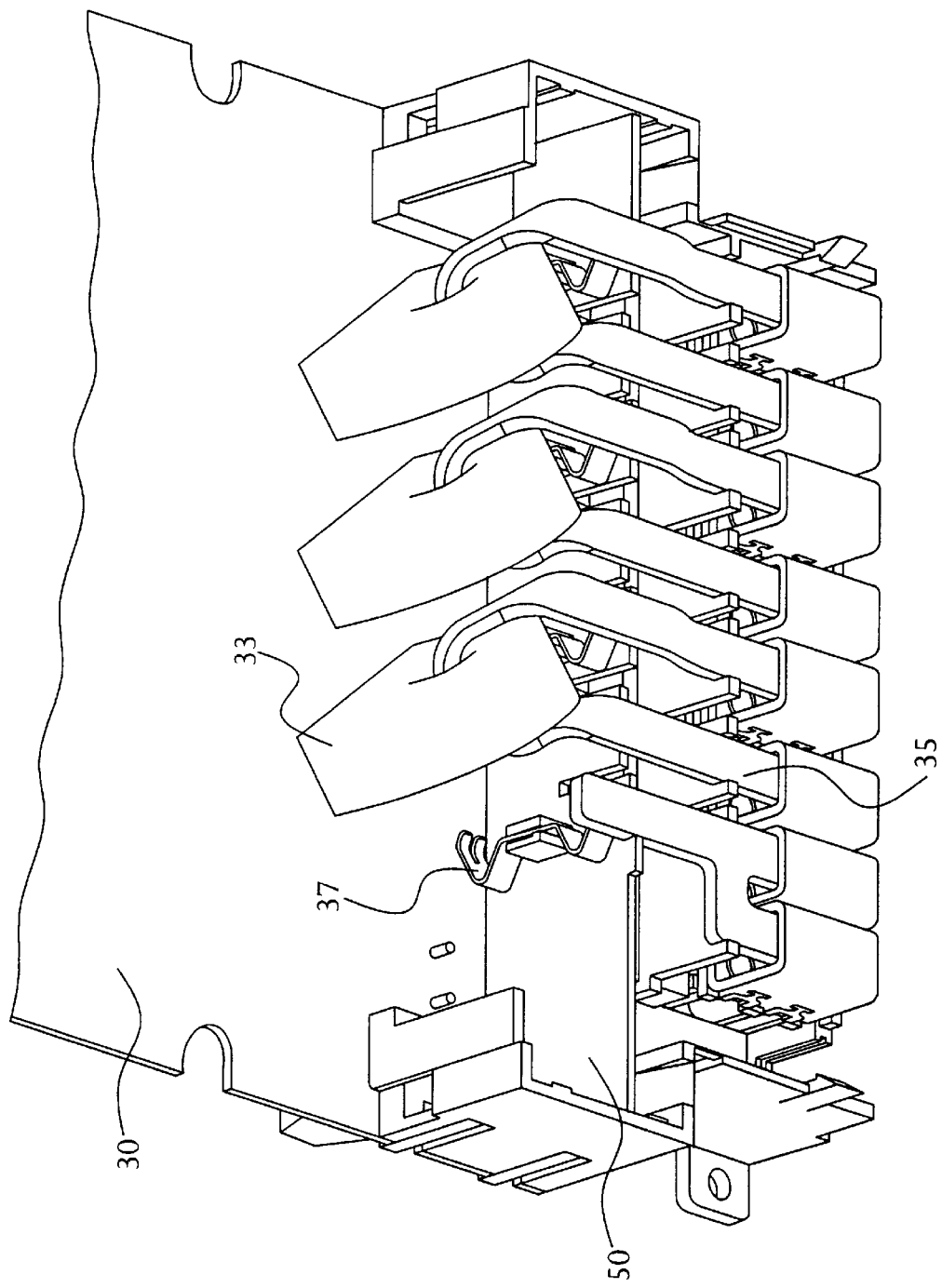
FIG. 8 is a side perspective view of an exemplary current sensor assembly with circuit board assembly, partial terminal block, and a contact spring in accordance with the present invention.
Figure 9:
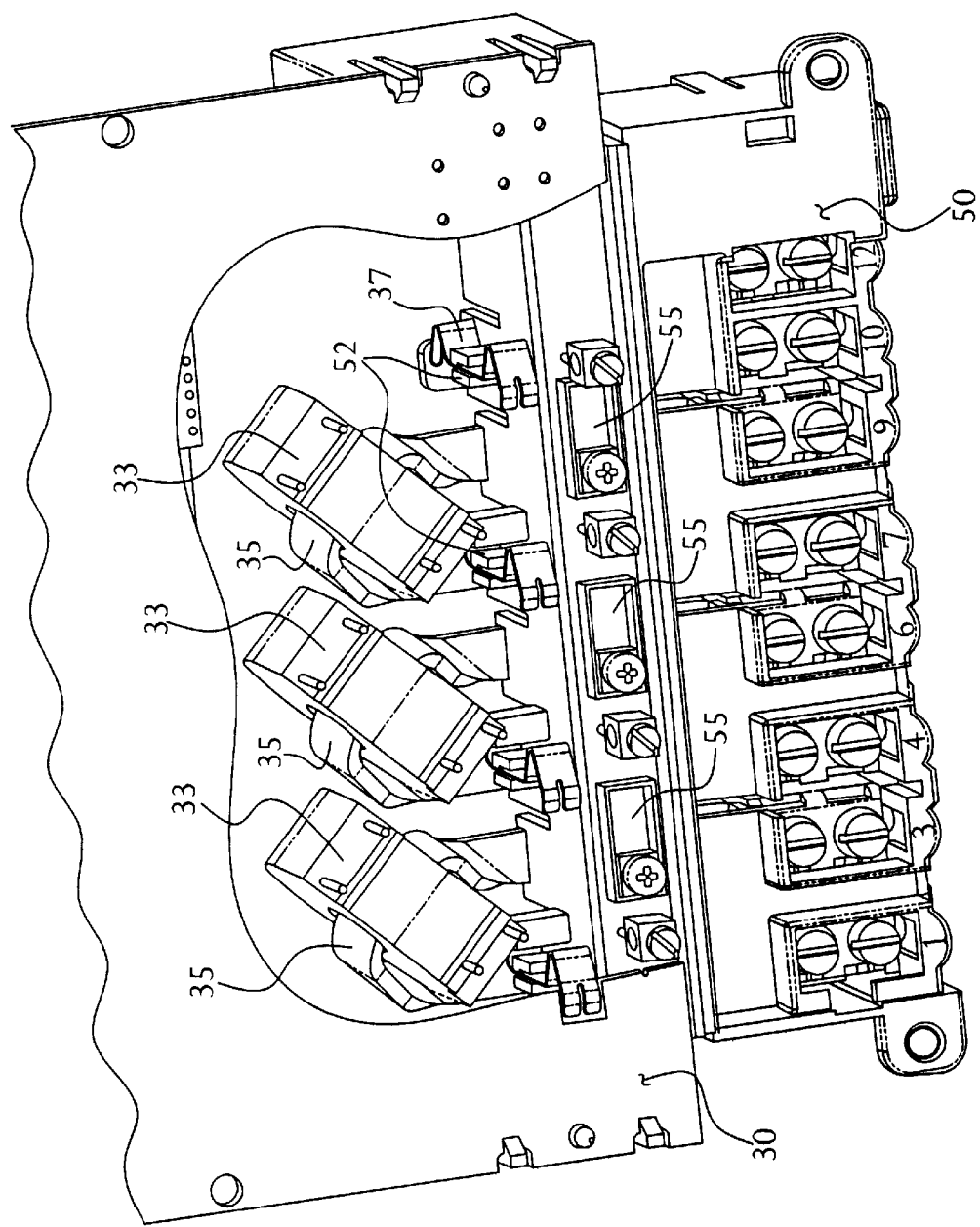
FIG. 9 is an opposing view of FIG. 8, with a cutaway portion of the circuit board.
Figure 10:
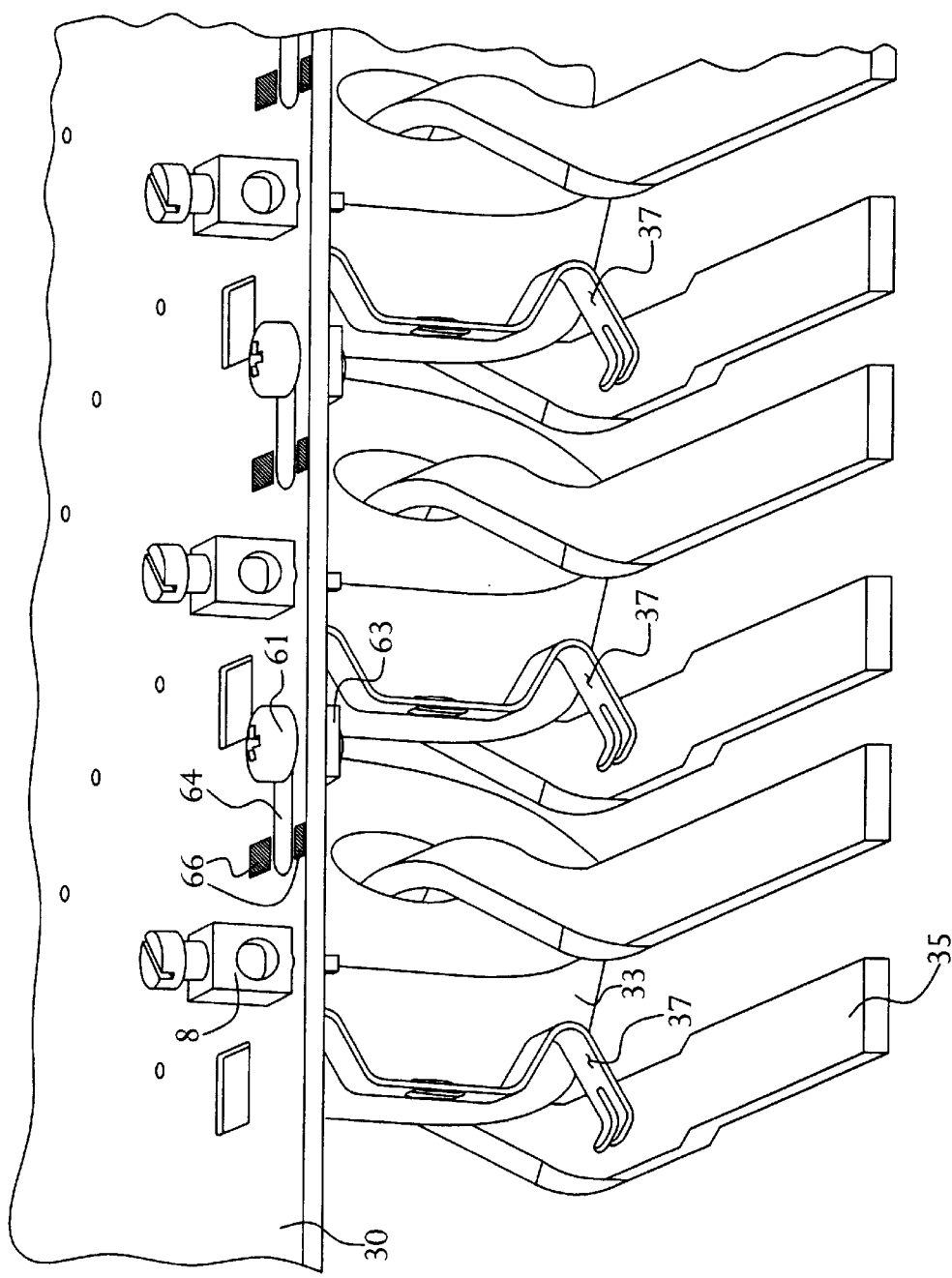
FIG. 10 is a perspective view of an exemplary current sensor assembly with a contact spring in accordance with the present invention.

FIG. 8 shows a front perspective view of the circuit board assembly 30 attached to the partial terminal block 50 in accordance with the present invention, and FIG. 9 shows an opposing perspective (cutaway) view. A flexible voltage contact spring 37 under stress and compression acts as a spring connection and provides a wireless and solderless voltage connection between current conductors 35 and the circuit board assembly 30, thereby connecting the partial terminal block 50 with the circuit board assembly 30. A side view of the interconnection of the circuit board assembly 30 and the current conductors is shown in FIG. 10.

Figure 11:
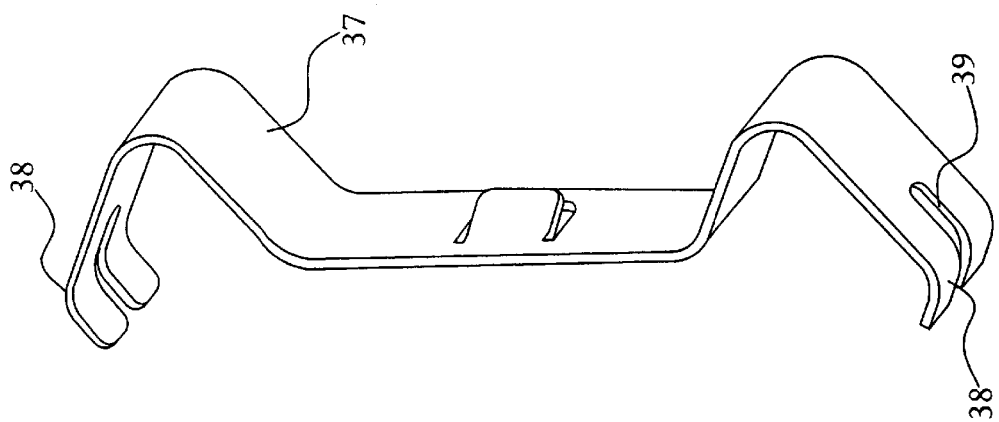
FIG. 11 is a perspective view of an exemplary contact spring in accordance with the present invention.

An exemplary spring is shown in FIG. 11. The spring can comprise any material with adequate mechanical properties and electrical conductivity properties, such as stainless steel, phosphor bronze, or Be—Cu. Each contact area 38 of the spring is bifurcated 39 to yield a redundant contact point further enhancing the reliability of the connection.

The spring 37 is an axially loaded leaf spring design that is used to make the voltage connection between the current phase input to the circuit board assembly 30. This mechanical connection is designed to maintain adequate contact pressure to result in a gastight electrical connection under the environmental conditions the product is rated for. The spring design eliminates flying leads and point-to-point wiring within the meter assembly. This design greatly simplifies the physical assembly of the product. As shown in FIG. 9, the spring 37 is retained in the assembly 30 by features 52 molded into the terminal block upper half 50. No special tools are required for the assembly of these parts.

Figure 12:
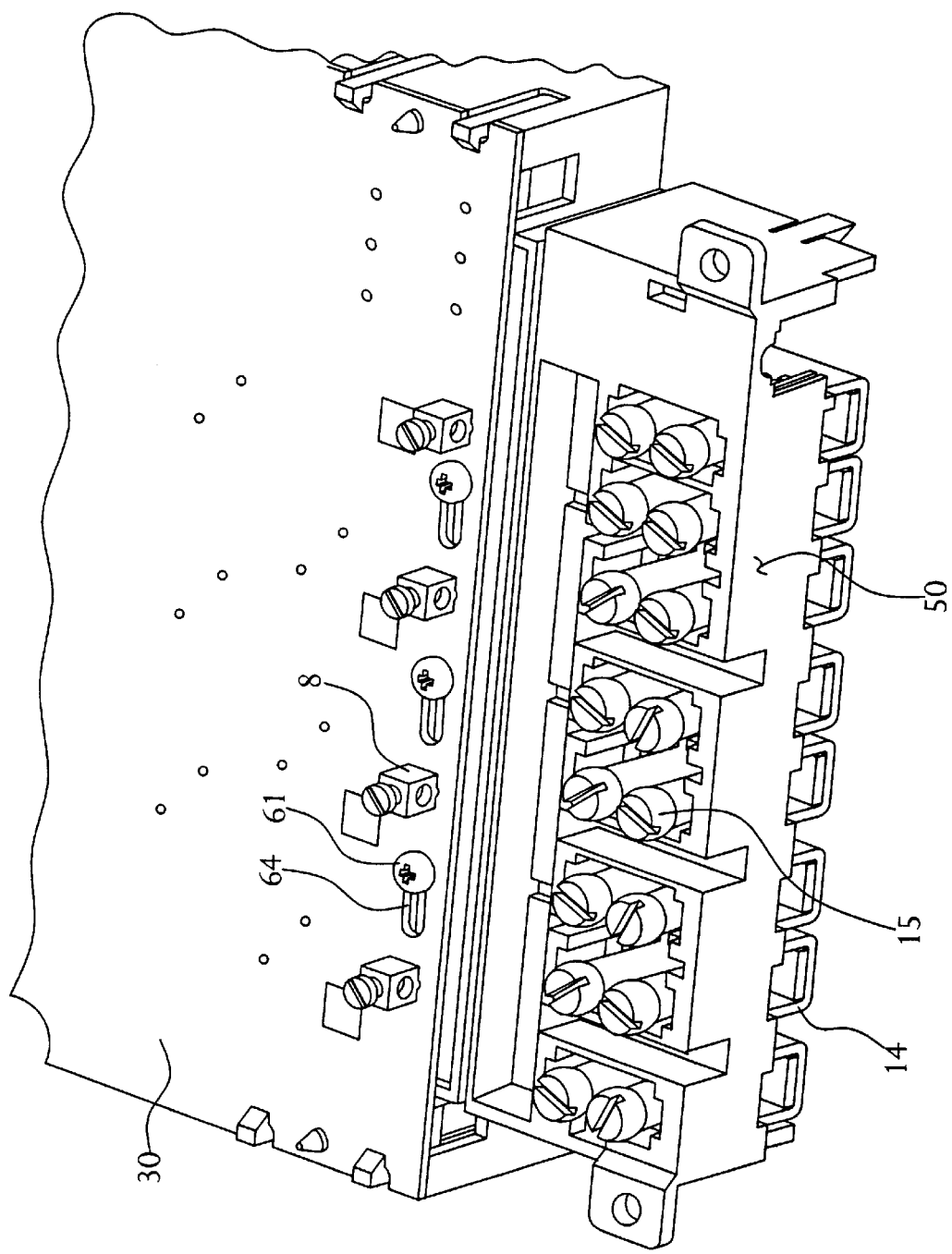
FIG. 12 is a perspective view of an exemplary voltage disconnect link in accordance with the present invention.
Figure 13:
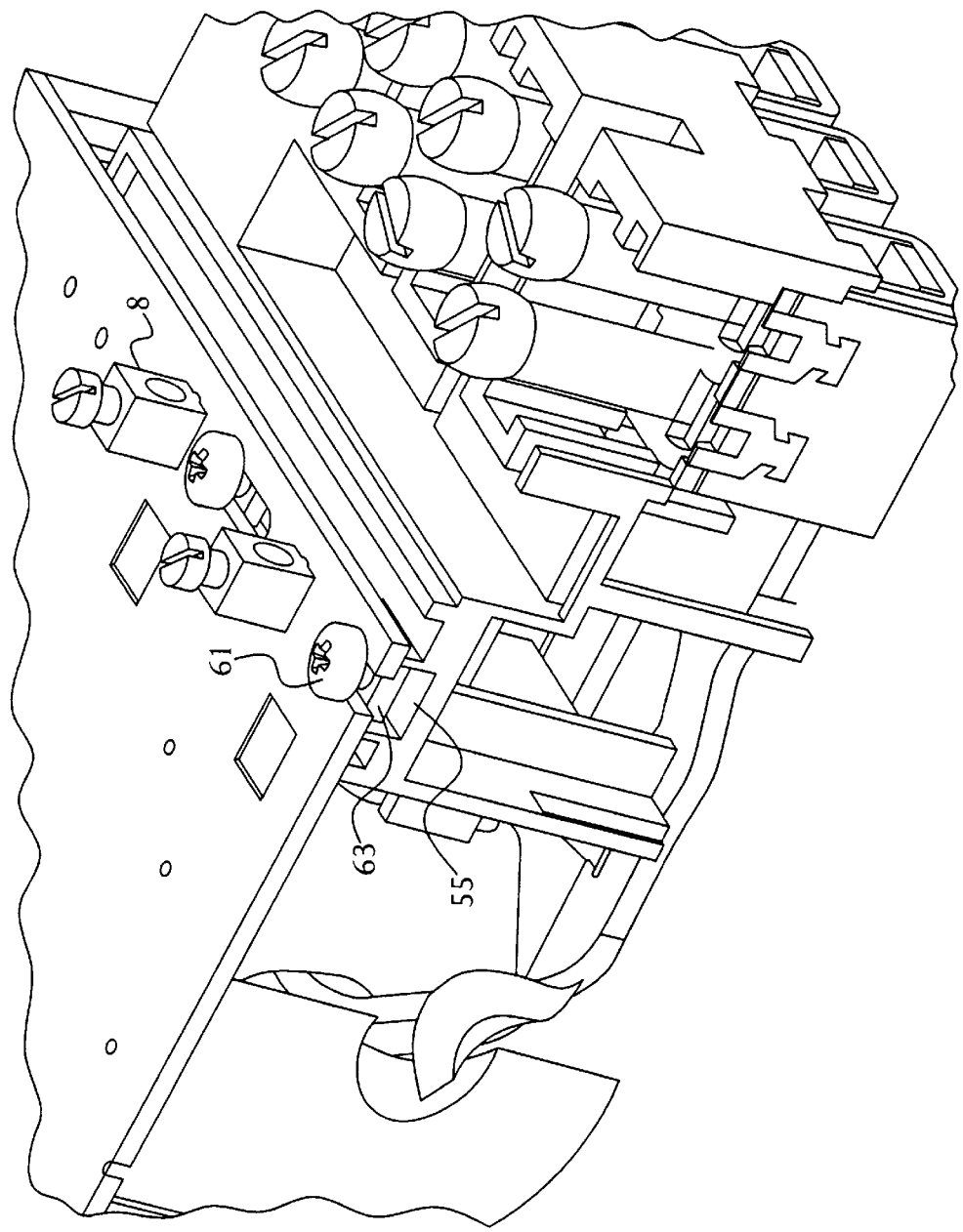
FIG. 13 is a cutaway side view of FIG. 12.

A voltage disconnect link is provided in an exemplary embodiment of the invention. The disconnect link of the present invention replaces remote wired hardware that is conventionally used as a voltage disconnect link. The disconnect link is used to isolate current and voltage sources during testing and calibration on some types of test equipment. The voltage disconnect link comprises voltage disconnect screw 61, a voltage disconnect square nut 63, and a voltage disconnect slot 64 in the circuit board assembly 30, as shown in FIGS. 10, 12 and 13. The circuit board assembly 30 has at least one voltage disconnect link circuit pad 66 on a side of the voltage disconnect slot 64, and can have more than one circuit pad 66 on the sides of the slot 64. The voltage disconnect screw 61 and the voltage disconnect square nut 63 are assembled to slide in the slot 64. At one end of the travel, the circuit pads 66 are shorted out by their contact with the screw assembly 61/63, thereby completing the voltage circuit. At the other extreme travel position of the screw assembly 61/63 in the slot 64, the screw assembly 61/63 resides in a pocket 55 (preferably rectangular) that is preferably molded into the terminal block upper half 50. The pocket 55 in the terminal block upper half 50 prevents the rotation of the nut 63 and allows the assembly to be locked in either the open or closed position (with respect to the circuitry). Therefore, the voltage can be disconnected from a current source using this link assembly. To operate the disconnect link, a screwdriver is used to loosen the screw about ½ turn. At that point, the screw assembly 61/63 is free to slide in the slot 64 that it is assembled into. Also shown in FIGS. 12 and 13 is an auxiliary voltage connector 8.

Referring back to FIG. 1, the wiring cover 40 provides an access port 42 that allows access to an internal power connection jack 32 (disposed on the circuit board assembly 30, for example) in order to power up the meter for reading the stored data when the electrical service to the meter is interrupted, for example. An access port cover 44 is provided, and can comprise a weather resistant adhesive backed seal, for example, that is applied over the access port 42 in such a manner as to render the port impervious to dust and moisture, while providing tamper-evident and anti-tamper sealing. In order to access the internal power jack 32, a meter reader pierces, breaks, or removes the cover 44, and inserts an external power plug that is part of an external power pack assembly (not shown) through the access port 42 into the internal power connection jack 32. This permits the meter to be powered up for a data exchange. Once this operation is complete, the cover 44 can be replaced (or a new cover 44 applied) onto the wiring cover 40 over the access port 42.

The components of the meter preferably snap together during assembly, using tabs and grooves formed on the enclosure portions 10 and 20, for example, thereby eliminating the need for any screws. Anti-tamper seal screws 22 can be provided, for example, if required by the industry.

The arrangement of the components of the present invention simplifies the assembly steps, permitting simultaneous assembly in a clamshell fashion around the components, and, at the same time, yielding higher voltage creepage distances between components. The total number of components is reduced because some of the metal parts can be combined into one.

The meter package has a reduced number of parts, and the main circuit board assembly has the metering electronics on board, thereby eliminating the need for flying leads and point-to-point wiring within the package. Thus, the meter package is mechanically simplified compared to presently available meter packages, resulting in a lower cost and a more reliable meter contained therein.

Figure 14:
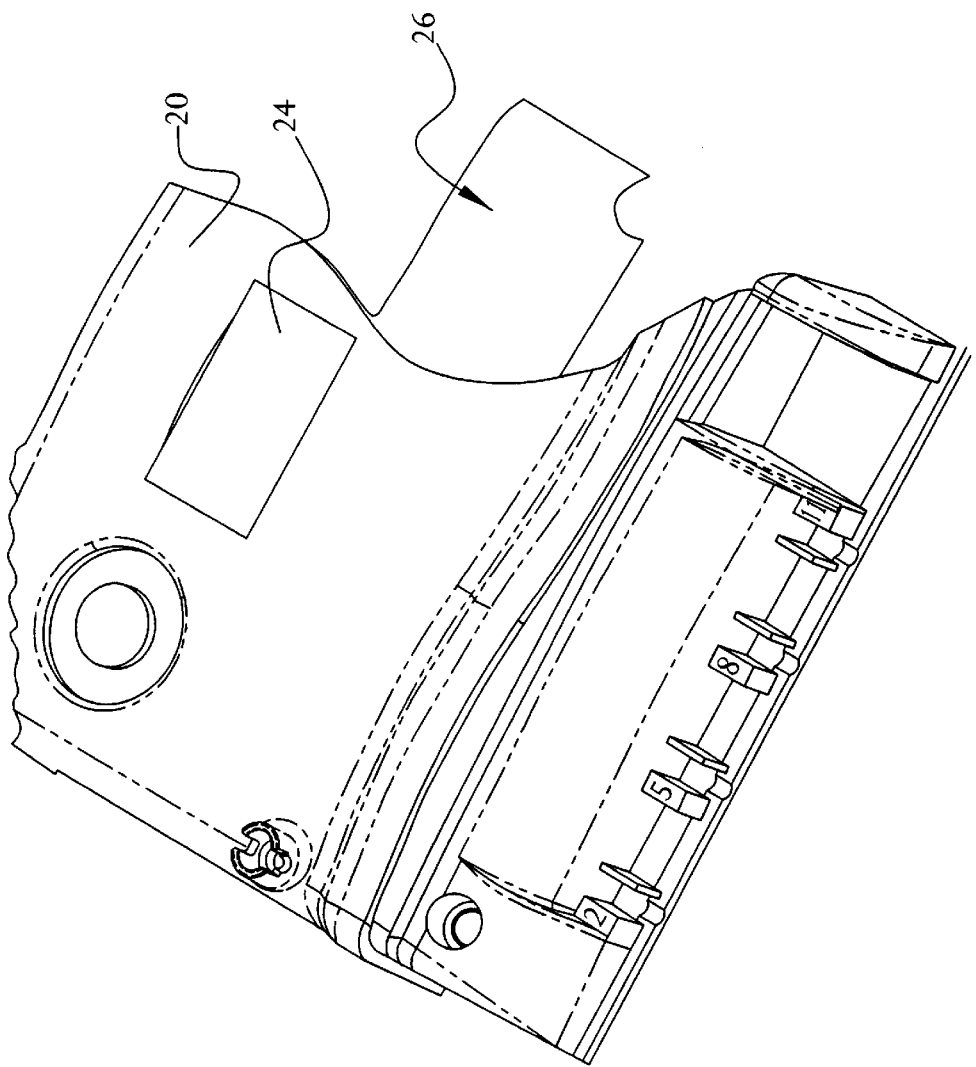
FIG. 14 is a schematic diagram showing an exemplary data label incorporated into a meter package in accordance with the present invention.
Figure 15:
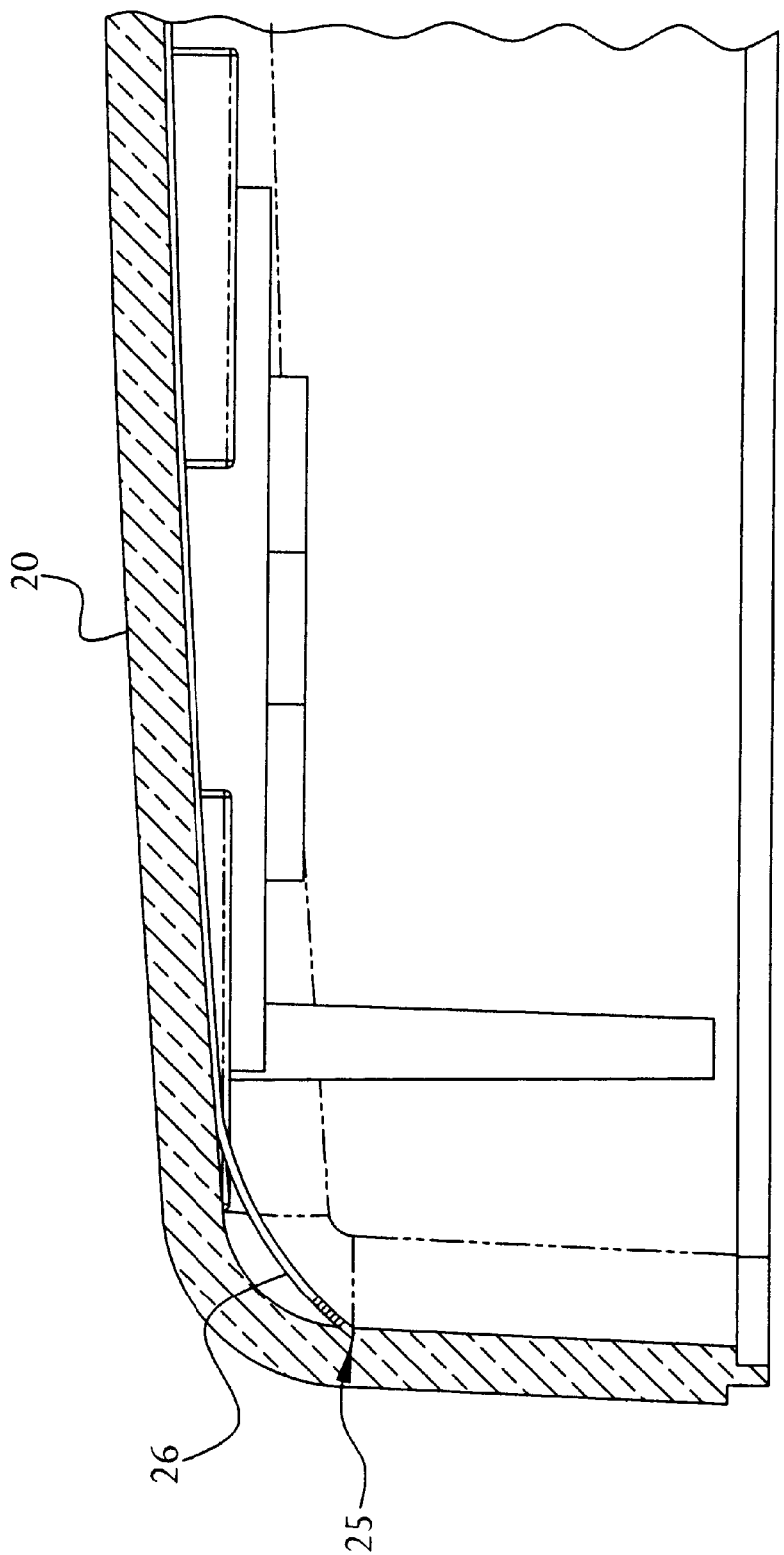
FIG. 15 is a cross-sectional view of an exemplary data label incorporated into a meter package in accordance with the present invention.

According to an embodiment of the invention, the second enclosure portion 20 comprises a serialized data label 26, as shown in FIG. 14. The data label 26 is preferably formed of a plastic, and has data (e.g., meter serial number, specification information, etc.) directly printed thereon, by a thermal transfer technique, for example. The data label can have any desired dimensions and size, such as a rectangle that fits behind the window 24. Preferably, the data label 26 snap-fits onto molded retainer features 25 of the second enclosure portion 20 next to the window 24, so that the data can be viewed through the window 24. The molded retainer features can be ribs or grooves, for example. The second enclosure portion 20 preferably has a curved surface, as shown in FIG. 15, that assists in retaining the snap-fit label and provides rigidity to the enclosure portion 20. The snap-fit eliminates the need for adhesive which prior art meter labels and nameplates rely on. Preferable material for the data label 26 is 0.010" top coated DuPont polyester stock, manufactured by the DuPont, Wilmington, Del. Furthermore, because of the snap-fit, tedious and careful placement of an adhesive-backed label is avoided.

Figure 16:
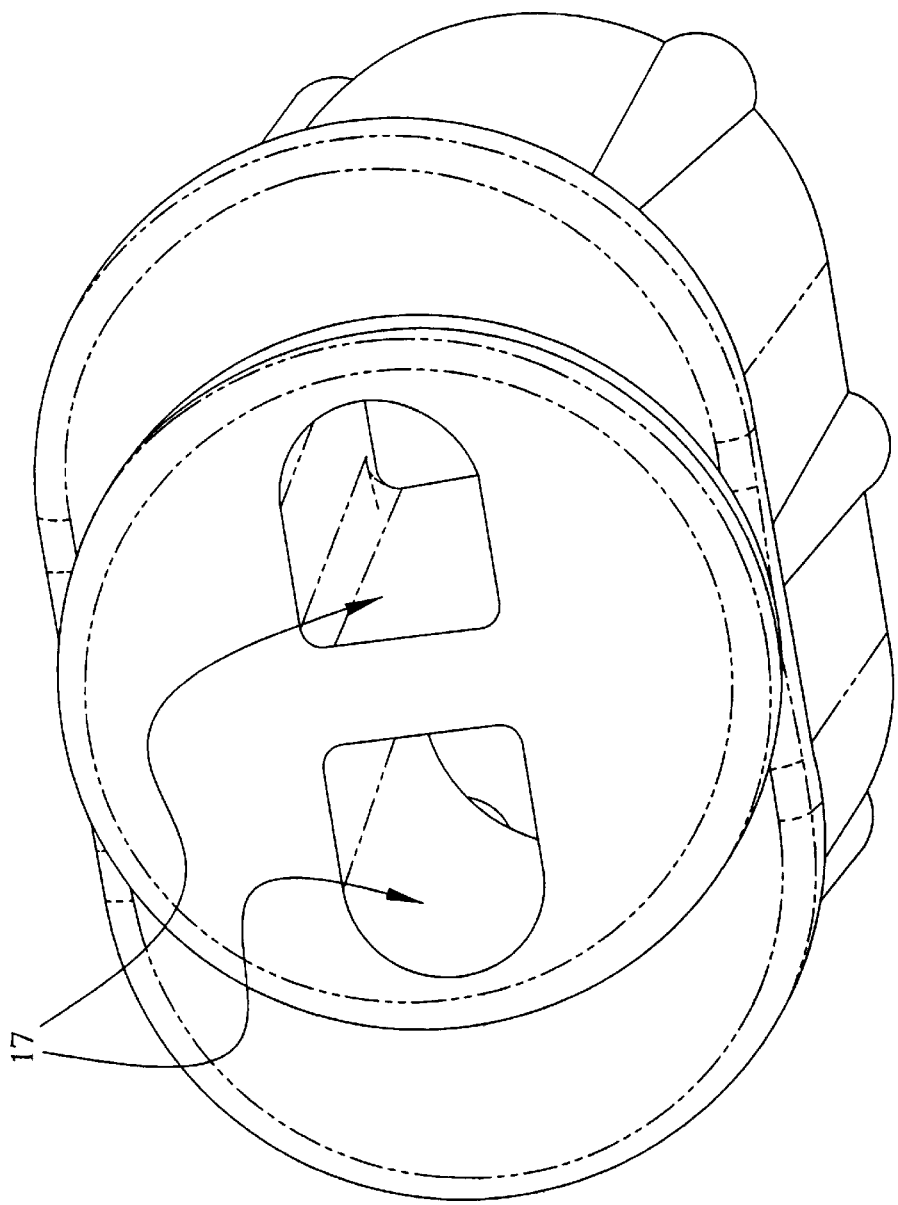
FIG. 16 is a front perspective view of an exemplary binocular in accordance with the present invention.
Figure 17:
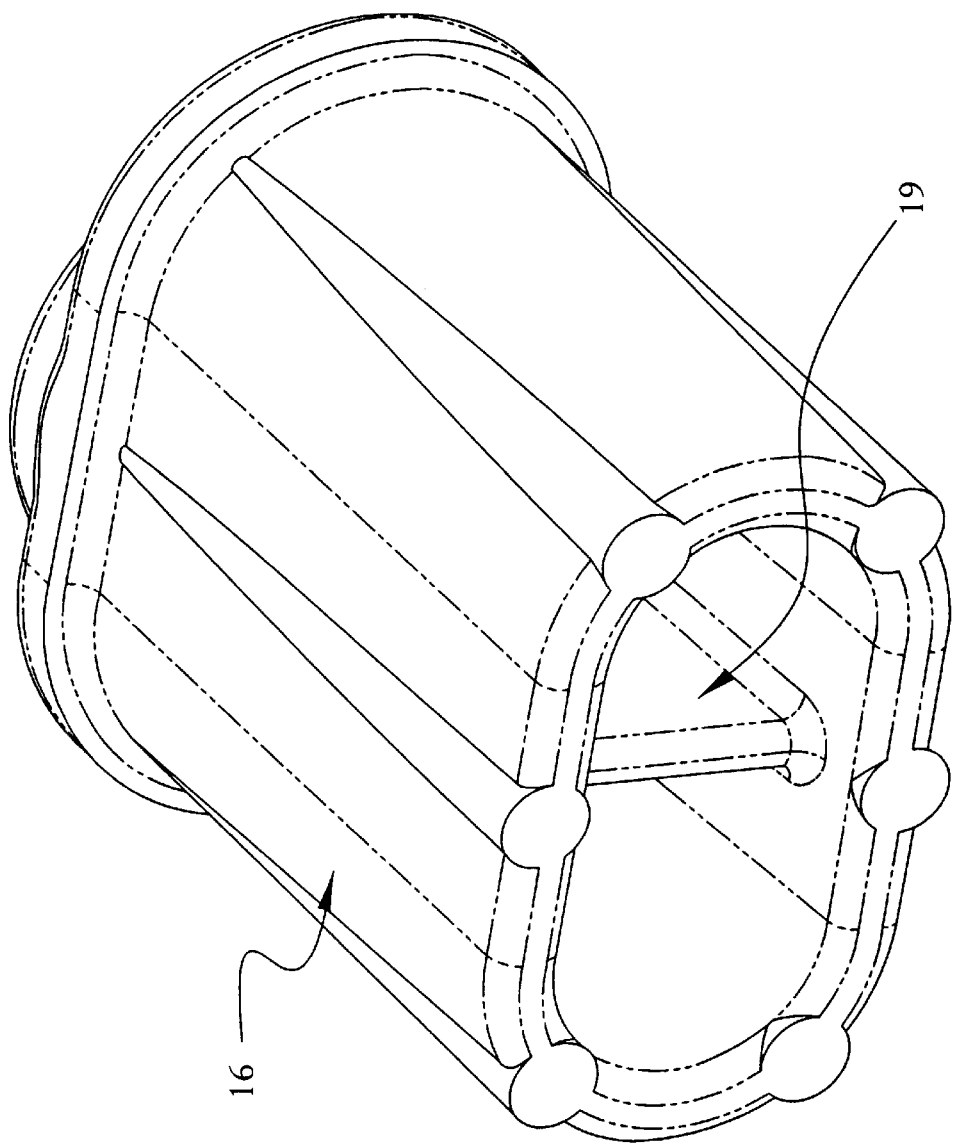
FIG. 17 is a rear perspective view of an exemplary binocular in accordance with the present invention.
Figure 18:
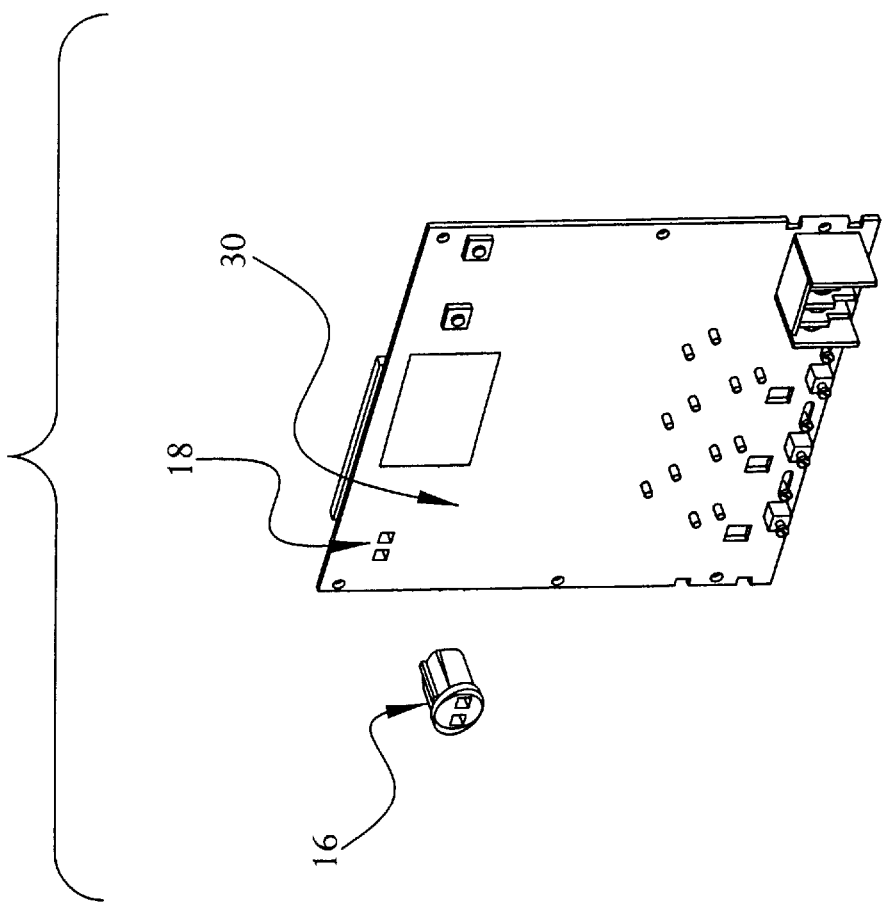
FIG. 18 is a schematic diagram showing a binocular and an associated circuit board assembly in accordance with the present invention.

For optical communication, a device called a binocular 16, as shown in FIGS. 1, 16, and 17, is used. The binocular 16 provides an uninterrupted link between the meter and an external device. The binocular comprises two directional guides 17 for LEDs 18 mounted on the circuit board 30, as shown in FIG. 18, and separated by a rib 19. Preferably, the binocular 16 is molded out of an opaque resilient material, such as a thermoplastic elastomer, although any material can be used. The binocular 16 allows full contact between the second enclosure portion 20 and the circuit board assembly 30, thereby ensuring maximum shielding of ambient light. The rib 19 prevents crosstalk between the LEDs 18. Because the binocular 16 comprises a resilient material, it is flexible and not rigid and compensates for variance in tolerances of all the parts involved, thereby producing a good press fit under a large variance. This also will act as a shock absorber for the assembly. It should be noted that the binocular 16 is more desirable than using two separate, individual prior art light pipes to guide light signals because there is much less attenuation of the signal through the open air of the binocular directional guides 17 than in the imperfect transparent solids of conventional light pipes.

Figure 19:
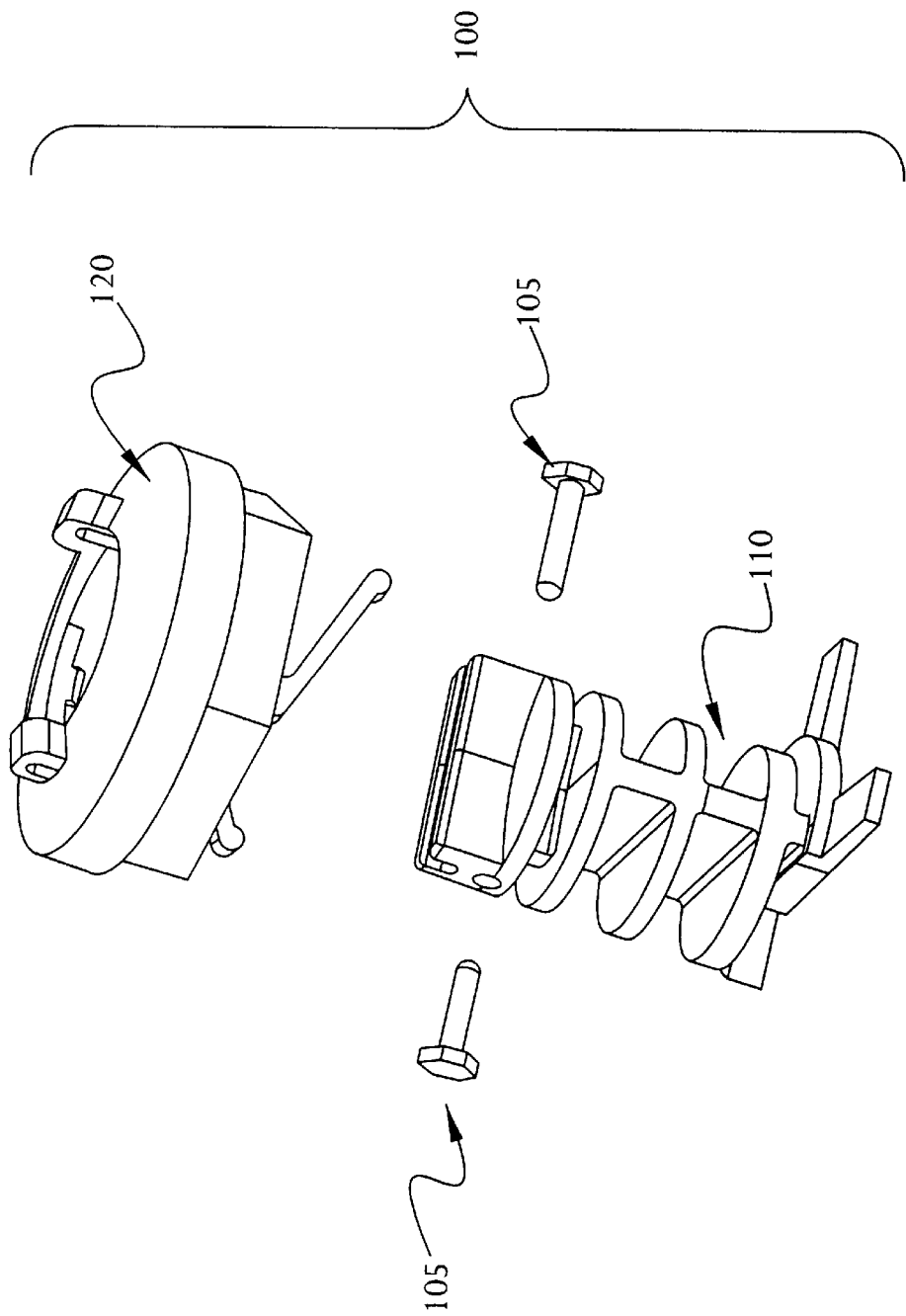
FIG. 19 is a perspective view of an exemplary actuator switch (exploded) in accordance with the present invention.
Figure 23:
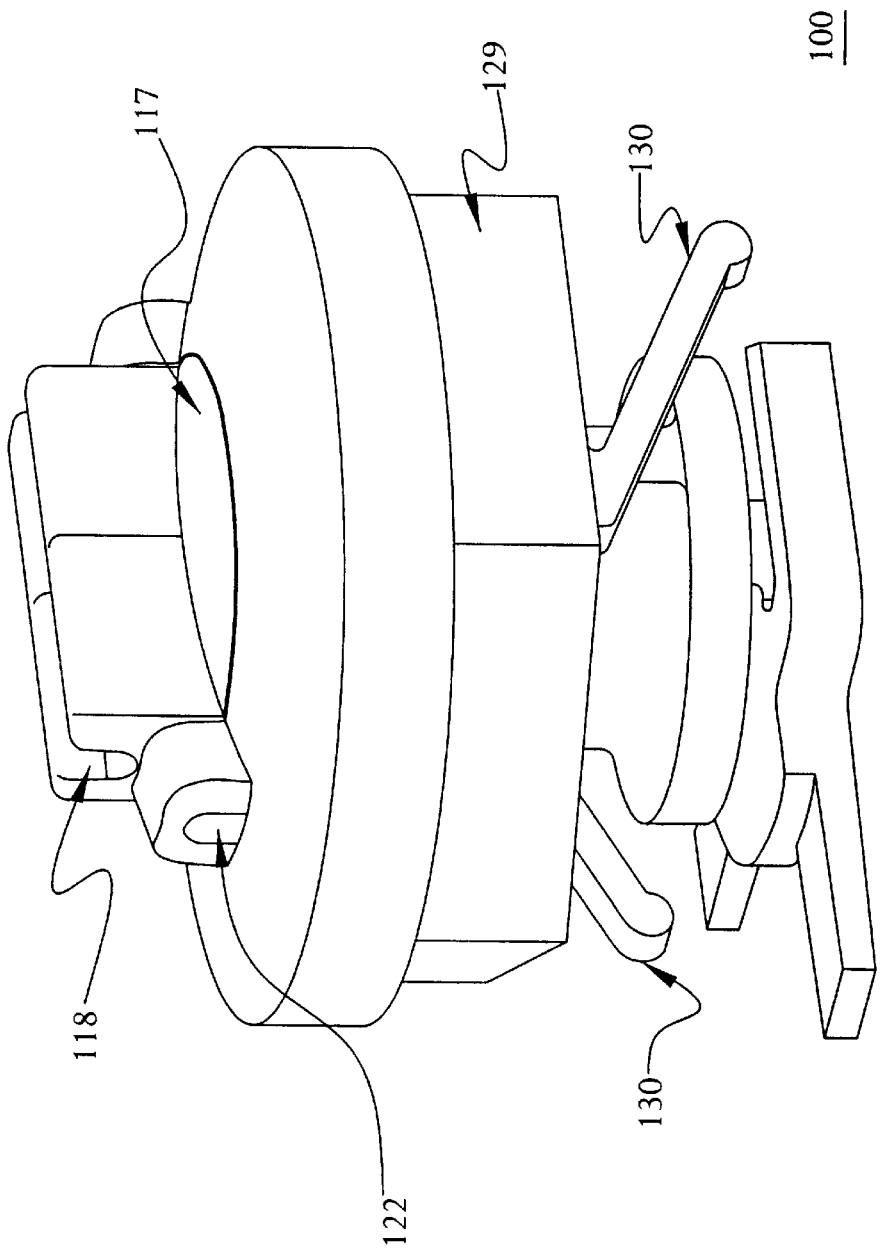
FIG. 23 is a perspective view of an exemplary actuator switch (assembled) in accordance with the present invention.

According to an embodiment of the invention, an actuator switch is incorporated into the meter. An exploded perspective view of an exemplary actuator switch 100 is shown in FIG. 19 (exploded) and FIG. 23 (assembled). The actuator switch 100 can be used to actuate multiple concealed switches of any kind. The switch 100 comprises an inner actuator 110 and an outer housing 120 that are assembled in the second enclosure portion 20.

Figure 20:
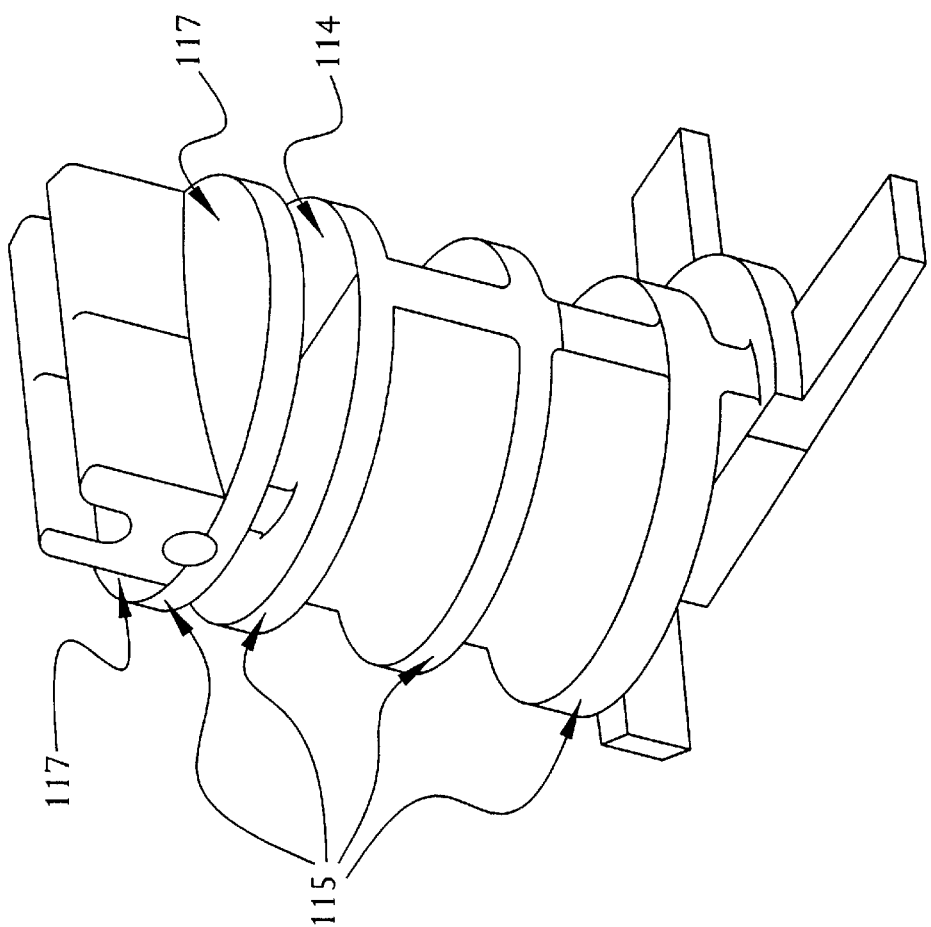
FIG. 20 is a perspective view of an exemplary inner actuator of an actuator switch in accordance with the present invention.
Figure 21:
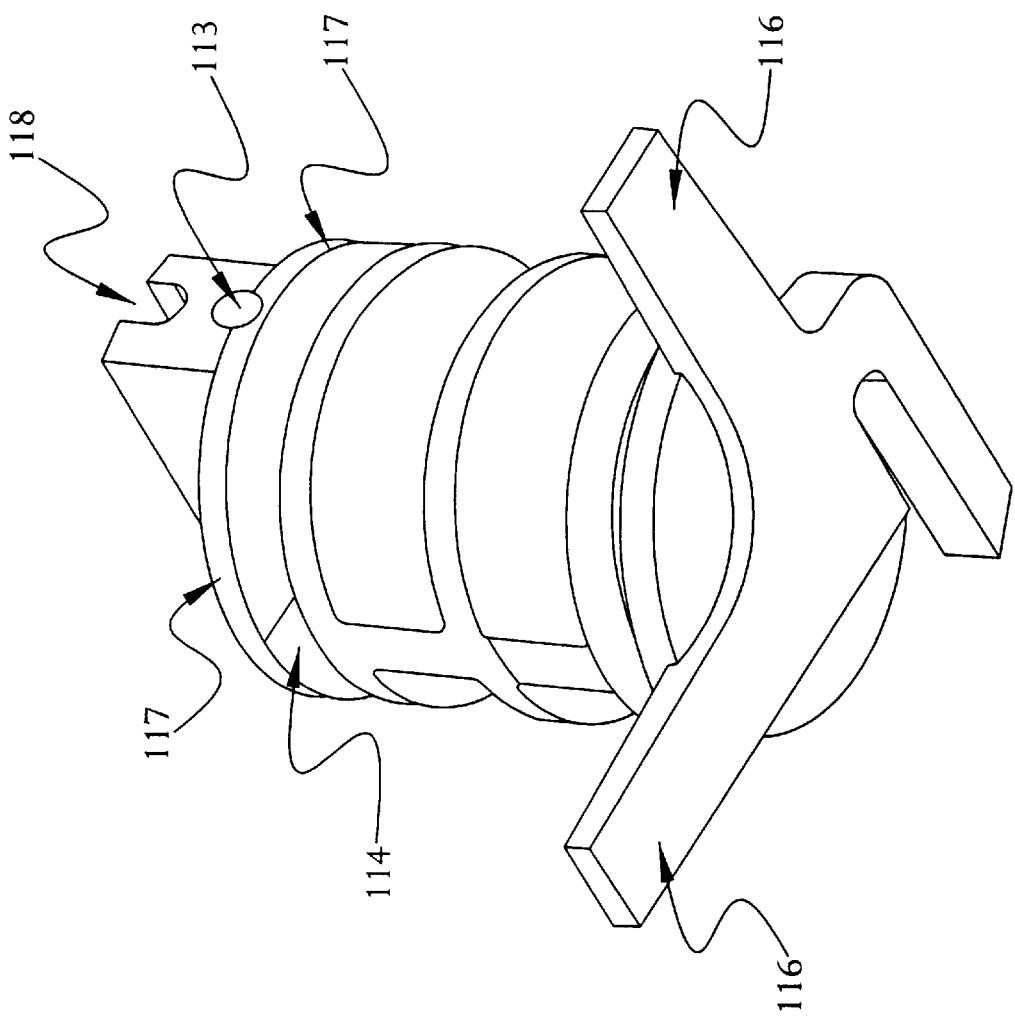
FIG. 21 is a bottom perspective view of an exemplary inner actuator in accordance with the present invention.
Figure 22:
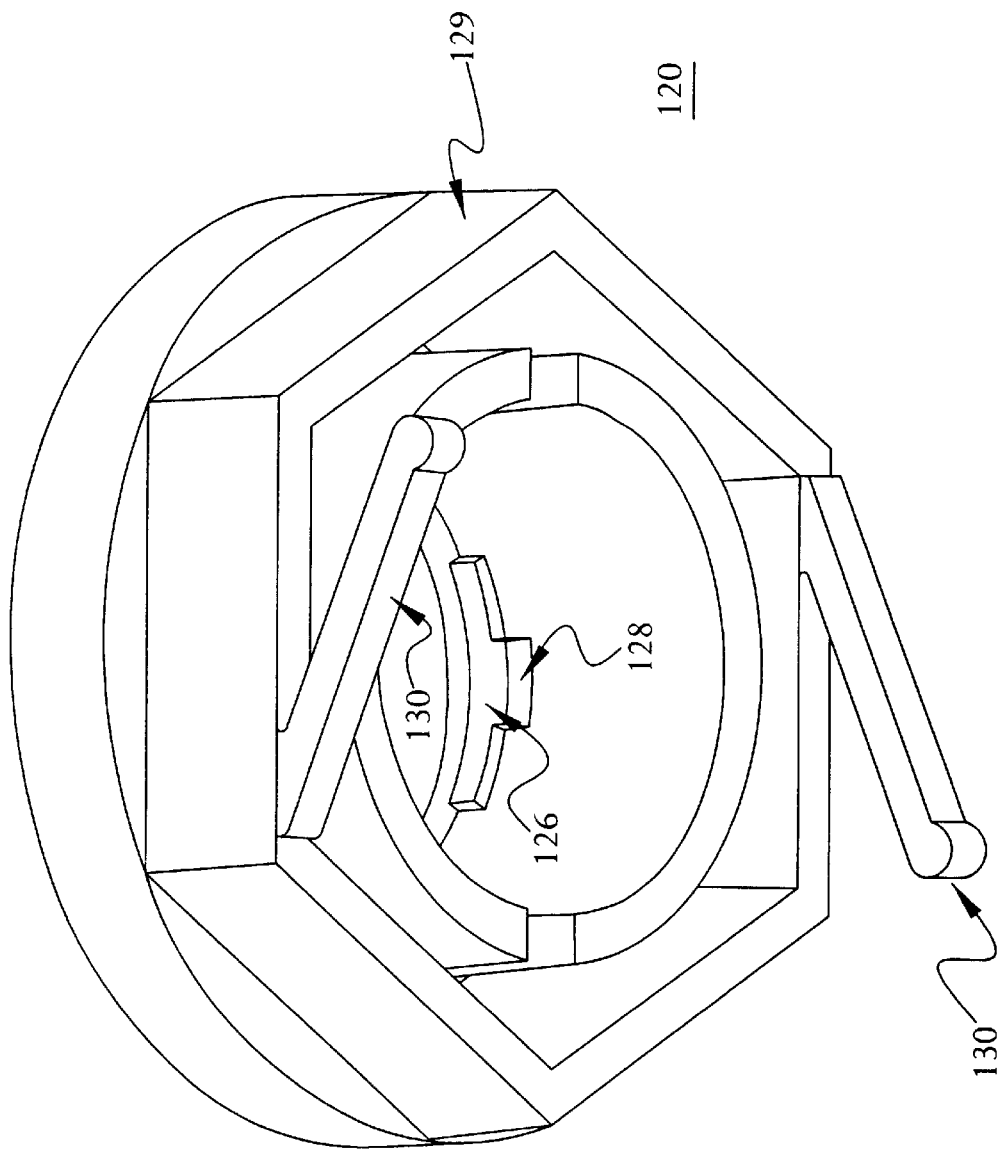
FIG. 22 is a perspective view of an exemplary outer housing of an actuator switch in accordance with the present invention.

FIGS. 20 and 21 show a top view and a bottom view, respectively, of an exemplary inner actuator 110. An upper gap 114 in the ribs 115 of the inner actuator 110 corresponds with the locking-tab 126 on the inside of the outer housing 120 (FIG. 22). These features interlock together when the inner actuator 110 is inserted into the back of the outer housing 120. Specifically, these features interlock together when the inner actuator 1 10 is inserted into the back of the second enclosure portion 20 and the outer housing 120 is inserted into the front of the second enclosure portion 20. This keeps the assembly together and forces the inner actuator 110 and the outer housing 120 to travel up and down together. However, the inner actuator 110 is free to rotate within the outer housing 120. Both sides of the flange 117 that forms the upper surface of the inner actuator 110 are designed to flex downward and give way to the locking-tab 126. Referring to FIG. 22, the chamfer 128 on the bottom of the locking-tab 126 is designed to assist in the assembly process while preventing disassembly. The hex area 129 inhibits the outer housing 120 from turning within the second enclosure portion 20. This also limits the downward travel of the actuator switch within the second enclosure portion 20.

Figure 24:
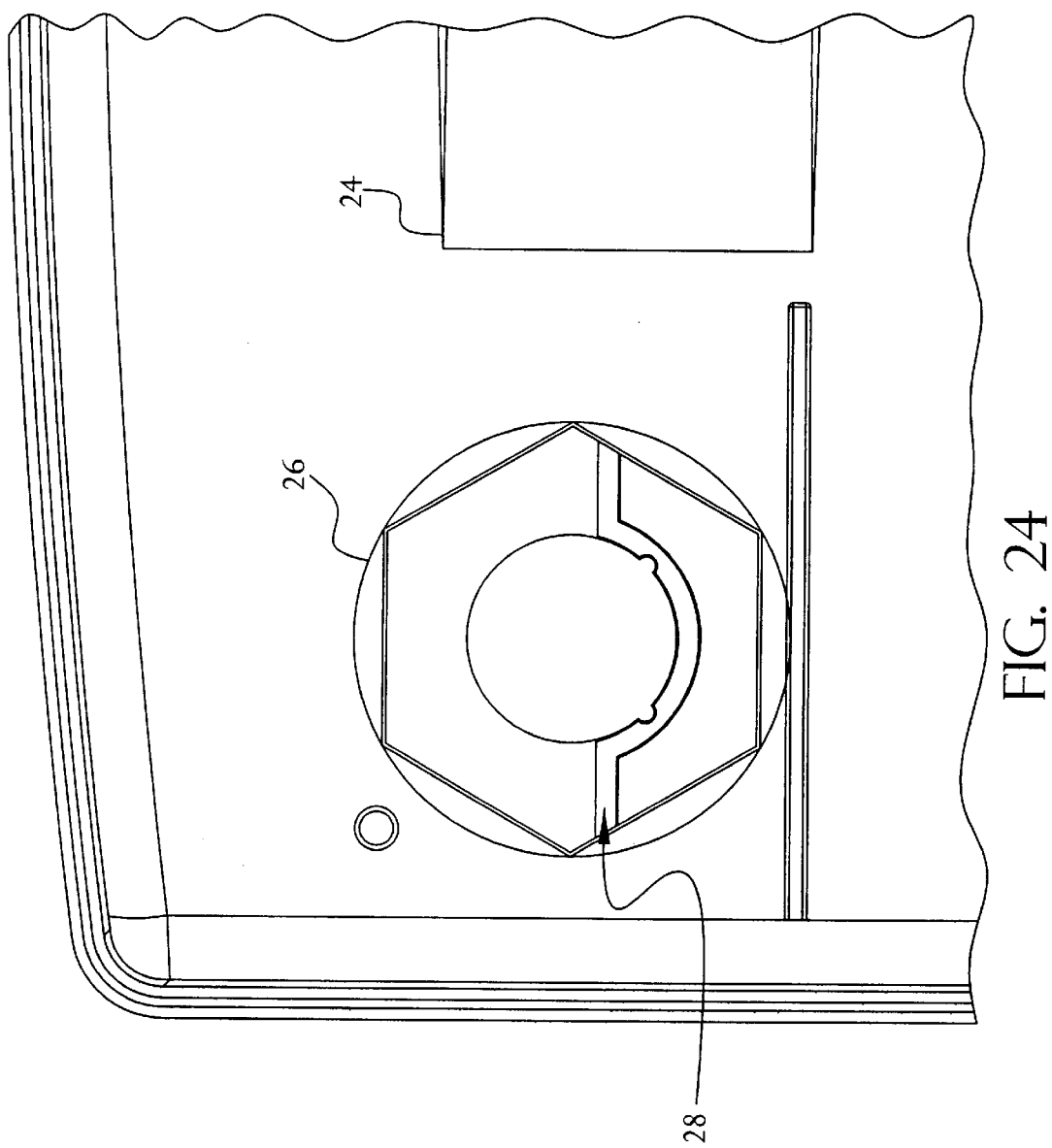
FIG. 24 is a rear view of a portion of an exemplary second enclosure portion in accordance with the present invention.

Cantilevered spring features 130 are disposed on the bottom of the outer housing 120 that return the switch to its up position. The actuator switch 100 is disposed through a hole 26 in the second enclosure portion 20. FIG. 24 shows a rear view of a portion of the second enclosure portion 20. A boss 28 is disposed in the hole 26 on the back of the second enclosure portion 20 that limits the rotation of the inner actuator 110 to about 90 degrees either way. There are holes 122 in the outer housing 120 and another hole 113 in the inner actuator 110 that provide a way of sealing the actuator switch to a position where it will not rotate. This is to isolate one of the functions while still being able to actuate the other. There are two substantially flat flanges 116 on the bottom of the inner actuator 110. These are preferably, but not be limited to, about 90 degrees apart. In this case, the flanges 116 interfere with associated tactile switches mounted on a circuit board. The drafting and coring features are present to reduce material and make the parts easier to mold. Molded plugs 105 are provided to prevent the rotation of the button without hampering the actuation of one of the switches. The slotted extension 118 on the top of the inner actuator 110 provides a way of turning assistance as with a coin or screwdriver.

Thus, the actuator switch can actuate or perform two functions with one button; i.e., it can activate two switches. First one switch is activated, and then the actuator switch is turned 90 degrees, and a second switch is activated. As described, the actuator switch is incorporated into the housing, and activates pads or switches on the underlying circuit board assembly 30.

While the invention has been described and illustrated with reference to specific embodiments, those skilled in the art will recognize that modification and variations may be made without departing from the principles of the invention as described hereinabove.

What is claimed is:

1. An energy meter, comprising:
   a first enclosure portion comprising a plurality of terminal block features;
   a circuit board assembly for performing metering functions and comprising a plurality of toroidal current sensors;
   a partial terminal block interlocking with the plurality of terminal block features to form voltage isolation between the plurality of toroidal current sensors and provide unrestricted access to the toroidal current sensors;
   a contact spring connecting the circuit board assembly and the partial terminal block; and
   a second enclosure portion, the first and second portions being mateable with each other to form a meter package, the circuit board assembly and partial terminal block at least partially contained within the meter package.

2. The energy meter of claim 1, further comprising a wiring cover connected to the second enclosure portion.

3. The energy meter of claim 1, wherein the second enclosure portion comprises a semi-transparent material.

4. The energy meter of claim 1, wherein the second enclosure portion has a window area.

5. The energy meter of claim 1, wherein the current sensors are disposed substantially in parallel with each other, and at approximately 45-degree angles on the circuit board assembly with respect to an edge of the circuit board assembly.

6. The energy meter of claim 1, wherein the contact spring comprises bifurcated ends.

7. The energy meter of claim 1, further comprising a data label displaying data, the data label attached to the second enclosure portion.

8. The energy meter of claim 1, further comprising a plurality of current conductors, each current conductor disposed through an associated current sensor.

9. The energy meter of claim 8, wherein each current conductor comprises a flat wire, and the ends of each wire are fastened to the partial terminal block.

10. The energy meter of claim 1, wherein the circuit board assembly further comprises a voltage disconnect link.

11. The energy meter of claim 10, wherein the voltage disconnect link comprises a voltage disconnect screw, a voltage disconnect square nut, and the circuit board assembly further comprises a voltage disconnect slot and a voltage disconnect link circuit pad on at least one side of the voltage disconnect slot.

12. The energy meter of claim 11, wherein the partial terminal block comprises a pocket for guiding the voltage disconnect link.

13. The energy meter of claim 1, further comprising an actuator switch.

14. The energy meter of claim 13, wherein the actuator switch comprises an inner actuator and an outer housing, the inner actuator connecting to the outer housing through the second enclosure portion.

15. The energy meter of claim 14, wherein the inner actuator comprises ribs separated by at least one gap, and the outer housing comprises a locking-tab, the locking-tab corresponding to the at least one gap for interlocking.

16. An energy meter, comprising:

a first enclosure portion comprising a plurality of terminal block features;

a circuit board assembly for performing metering functions and comprising a plurality of toroidal current sensors;

a partial terminal block interlocking with the plurality of terminal block features to form voltage isolation between the plurality of toroidal current sensors and provide unrestricted access to the toroidal current sensors;

a second enclosure portion, the first and second portions being mateable with each other to form a meter package, the circuit board assembly and partial terminal block at least partially contained within the meter package; and a binocular disposed between the second enclosure portion and the circuit board assembly.

17. The energy meter of claim 16, wherein the binocular comprises two directional guides separated by a rib.

* * * * *